United States Patent [19]

Itahana et al.

[11] Patent Number: 4,864,385
[45] Date of Patent: Sep. 5, 1989

[54] POWER SEMICONDUCTORS CONNECTED ANTIPARALLEL VIA HEATSINKS

[75] Inventors: Hiroshi Itahana; Yoshinori Usui; Takashi Tsuboi, all of Katsuta, Japan

[73] Assignee: Hitachi, Ltd., Tokyo, Japan

[21] Appl. No.: 138,862

[22] Filed: Dec. 29, 1987

[51] Int. Cl.[4] .................. H01L 23/46; H01L 23/48; H01L 23/42; H01L 25/16

[52] U.S. Cl. .................................. 357/82; 357/76; 357/81

[58] Field of Search ............................. 357/76, 81, 82

[56] References Cited

U.S. PATENT DOCUMENTS

| | | | |
|---|---|---|---|
| 4,492,975 | 1/1985 | Yamada et al. | 357/76 |
| 4,574,877 | 3/1986 | Klein | 357/82 |
| 4,628,219 | 12/1986 | Troscinski | 357/76 |
| 4,694,323 | 9/1987 | Itahana et al. | 357/82 |
| 4,745,315 | 5/1988 | Terry, Jr. et al. | 357/76 |

FOREIGN PATENT DOCUMENTS

| | | |
|---|---|---|
| 50-123277 | 9/1975 | Japan . |
| 51-115778 | 10/1976 | Japan . |
| 58-9349 | 1/1983 | Japan . |
| 58-135657 | 8/1983 | Japan . |

Primary Examiner—William D. Larkins
Attorney, Agent, or Firm—Antonelli, Terry & Wands

[57] ABSTRACT

A semiconductor device is provided which includes first and second semiconductor elements of different types stacked alternately. A plurality of cooling members are each disposed between the paired first and second semiconductor elements located adjacent to each other for cooling the semiconductor elements and electrically connecting the elements to each other. In other words, the cooling members will have one of the first semiconductor elements on one side and one of the second semiconductor elements on the other side. At least one connecting conductor is provided for connecting at least one of the first semiconductor elements and at least one of the second semiconductor elements in an anti-parallel connection and also for connecting a plurality of the anti-parallel connections in series to one another. Because the first and second semiconductor elements are of different types from one another which are placed under a maximum load at different times, the cooling members will not be subjected to a maximum load on both sides at the same time. Therefore, the size of the cooling member can be decreased because it will only have to provide maximum cooling to one of the first and second semiconductor elements at a time.

11 Claims, 9 Drawing Sheets

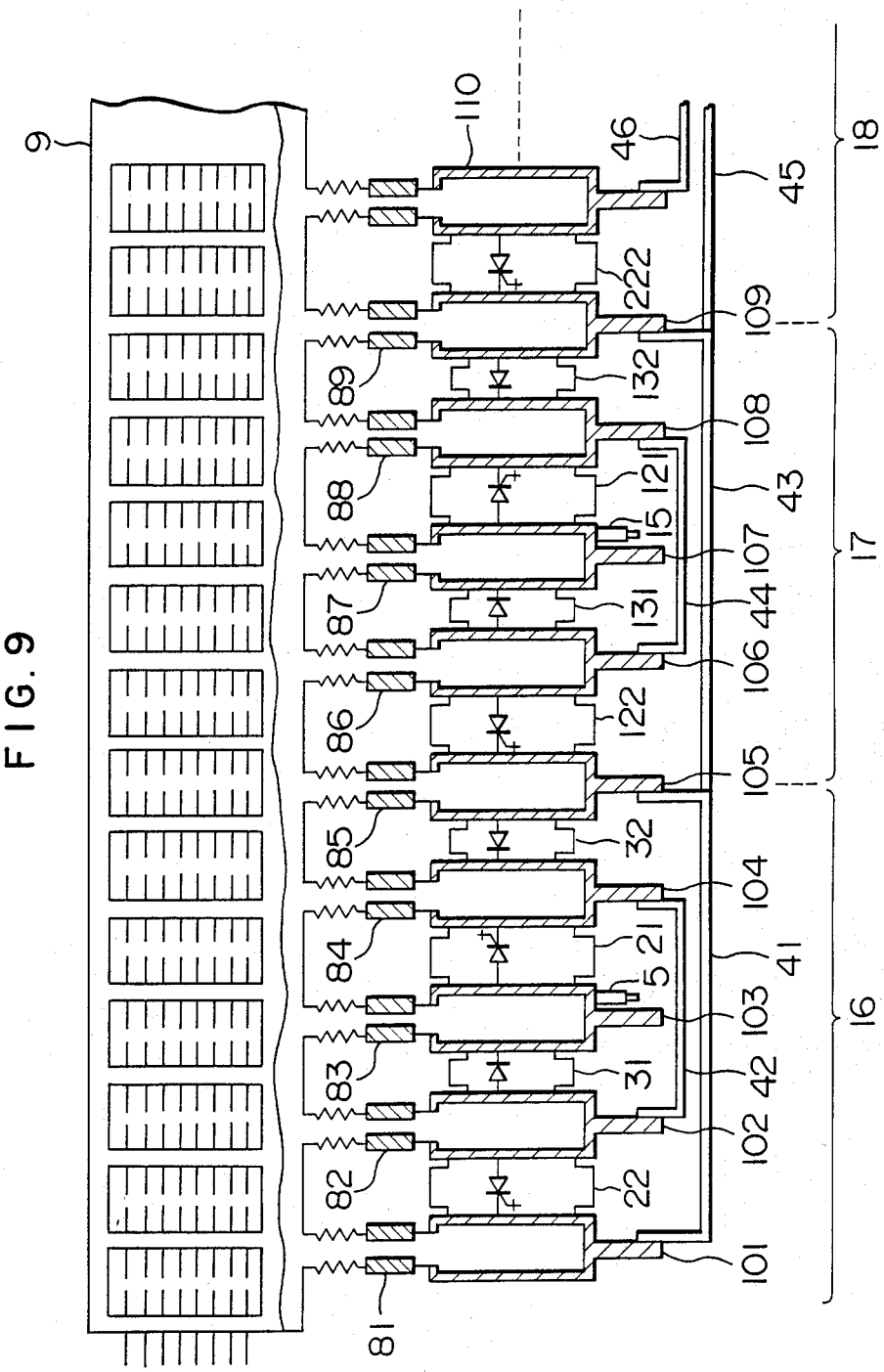

POWER SEMICONDUCTORS CONNECTED ANTIPARALLEL VIA HEATSINKS

BACKGROUND OF THE INVENTION

The present invention relates generally to a semiconductor device and more particularly to a semiconductor device suited for miniaturization.

As one type of semiconductor device, there has been known a circuit structure in which two different types of semiconductor elements are connected in parallel with polarities opposite to each other (i.e. in an anti-parallel connection) and in which a plurality of anti-parallel connections are connected in series to one another. As a typical one of this type of semiconductor device, there can be mentioned an inverter which is composed of gate turn-off thyristors (hereinafter also referred to as GTO in abbreviation). By way of example, reference may be made to Japanese Patent Application Kokai (Laid-Open) No. 9349/1983 (JP-A-58-9349).

As discussed also in the abovementioned publication, one of the most significant requirements imposed on this type of semiconductor device is the cooling of the device. In this conjunction, there have heretofore been made numerous proposals.

The semiconductor device disclosed in the abovementioned patent application is of such a structure in which a combination of two discrete GTOs is provided in each of the anti-parallel connections. In recent years, however, the combination of the two GTOs tends to be replaced by the single GTO with the advent of the gate turnoff thyristor of a large capacity. Increases in the capacity of the GTO is however accompanied with corresponding increases in the amount of heat generated by one GTO element, which in turn means that the cooling of the GTO device presents a more serious problem to be solved.

FIG. 1 of the accompanying drawings shows in a wiring diagram a general arrangement of a three-phase inverter in which each of the anti-parallel connections includes a single GTO. In each phase of this inverter circuit, e.g. in U-phase 16, a GTO 21 is connected in anti-parallel with a diode 31 to constitute an anti-parallel connection, which in turn is connected in series to another anti-parallel connection of a GTO 22 and a diode 32. Also in V-phase 17 and W-phase 18, identical circuit configurations are adopted, wherein all phase conductors are connected to a load such as an electric motor 19. In FIG. 1, a reference numeral 1 denotes a capacitor, 4 denotes a reactor, 5 denotes a diode and numerals 12 and 13 denote input terminals connected to a power supply source (not shown).

Now, considering the order of stacking the semiconductor elements 5, 21, 22, 31 and 32 which belongs to one phase, e.g. U-phase, they are connected electrically in such a manner as illustrated in FIG. 2 of the accompanying drawings. Further, these semiconductor elements are physically integrated in such a cooling structure as shown in FIG. 3, which is a typical one of the cooling structures known heretofore and so implemented as to cool the semiconductor elements by making use of vaporization of a cooling medium or coolant under heat generated by the semiconductor elements. For more particulars of the cooling structure known heretofore, reference may be made, for example, to Japanese Patent Application Kokai (Laid-Open) No. 123277/1975 (JP-A-50-123277).

Referring to FIG. 3, reference numerals 61 to 65 denote cooling fin members, respectively, each of which accommodates therein a coolant susceptible to boil at a relatively low temperature such as Fron (Freon) so that the coolant is vaporized under the heat generated by the adjacent semiconductor elements to thereby deprive the latter of heat. The resulting vapor is introduced into a condenser 9 through insulated tubes 81 to 85 to undergo heat-exchange with the ambient atmosphere.

In the cooling structure shown in FIG. 3, each of the fins 61 to 65 is heated by the adjacent semiconductor elements located on both sides. Consequently, each fin is required to exhibit a sufficiently high cooling capability in order to cool both of the associated semiconductor elements. In the past, this was accomplished only by increasing the size of the cooling fin. However, in the case of an inverter destined for controlling a drive motor for an electric car mounted underneath the car floor, severe restriction is imposed on the size of the device. In other words, a limit is encountered in increasing the size of the cooling fin. Under the circumstance, there exists a great demand for improving the structure of the semiconductor device such as the inverter inclusive of the cooling system so that the size of the device can be reduced.

SUMMARY OF THE INVENTION

Accordingly, an object of the present invention is to eliminate the disadvantages of the prior art semiconductor device and provide an improved structure of semiconductor device which is suited for being implemented in a small size.

In view of the above and other objects which will be apparent as the description proceeds, there is provided according to an aspect of the present invention a semiconductor device including a circuit in which at least a first semiconductor element is connected in anti-parallel with at least a second semiconductor element and in which a plurality of the anti-parallel connections are connected in series to one another, wherein the first and second semiconductor elements are alternately arrayed with a cooling fin being interposed between the adjacent first and second semiconductor elements for thereby cooling the adjacent semiconductor elements and at the same time to interconnect them electrically, and wherein the two cooling fins are electrically connected by at least a connecting conductor so that a plurality of anti-parallel connections each of the first and second semiconductor elements are connected in series to one another.

On the way to the present invention, the inventors have found that in the circuit in which a plurality of the anti-parallel connections each of first and second different types of semiconductor elements are connected in series to one another, the first and second semiconductor elements differ in principle in respect to the time point at which they are placed under the maximum load. Starting from this fact, it has been established that miniaturization of the cooling fin structure can be attained by stacking alternately the first and second semiconductor elements with interposition of a cooling fin therebetween.

Thus, with the arrangement described above, the cooling capability of the individual cooling fins can be uniformized, as the result of which the semiconductor device can be reduced in size significantly in view of the fact that when one of the first and second semiconductor elements is under a maximum load, the other element is not under the maximum load in principle.

By way of example, it is assumed that the inverter shown in FIG. 1 is used for controlling an induction motor for an electric car. In that case, the relationships between thermal load applied to the GTO and diode and the operation modes of the electric car are typically such as illustrated in FIGS. 4A and 4B. In these figures, curves $1$ and $2$ represent the thermal load characteristics of the GTO, a curve $3$ represents that of the diode, and a curve $4$ represents synthesized thermal load characteristics of the GTO and diode (i.e. the combination of the characteristic curves $1$ and $3$) Further, intervals $A_1$ and $A_2$ respectively represent a power running operation mode (starting period) of the electric car corresponding to the curves $1$ and $2$, an interval B represents a coasting operation mode and an interval C represents a regeneration braking mode. A broken line curve $2$ represents the thermal load characteristic in a coasting mode. As will be seen from comparison of these characteristic curves, the thermal load of the GTO, i.e. the amount of heat generated by the GTO is usually at maximum in the starting mode, while that of the diode is not at maximum at that time but lower than the thermal load of the GTO. On the other hand, in the regeneration braking mode, the thermal load of the GTO is small while that of the diode is increased to maximum beyond the thermal load of the GTO.

In this conjunction, it is noted that thermal time constant of a cooling fin designed to cool the associated semiconductor elements by making use of vaporization of the coolant is as small as on the order of 5 to 10 seconds, which is obviously shorter than the duration of the power running mode and the regeneration braking mode.

The load conditions mentioned above will be considered in connection with the known structure of the semiconductor device shown in FIG. 3. The cooling fin 62 is exposed to heat generated simultaneously by both GTOs 21 and 22 located on both sides of the fin 62, respectively. Consequently, in the power running mode, the cooling fin 62 is subjected to the maximum thermal load from both adjacent GTOs. Thus, at that time, the cooling fin 62 is required to have a larger size when compared with other fins 61, 63, 64 and 65 so as to exhibit a great heat dissipation capability. In contrast, in the regeneration braking mode, the thermal load of the cooling fin 64 sandwiched between the diodes 31 and 32 is increased, thus necessitating the cooling fin 64 to be realized in an increased size.

Thus, starting from the fact that when the GTOs are under the maximum load, the diodes are not under the maximum load and vice versa as well as the fact that the same conditions generally prevail in a circuit such as a chopper circuit or the like in which a plurality of antiparallel connections each including first and second semiconductor elements of different types are connected in series to one another, it is proposed according to the present invention that the first and the second semiconductor elements are to be alternately arrayed or stacked. More specifically, by stacking alternately the first and second types of semiconductor elements with the cooling fin being interposed therebetween in such a manner in which when one of the semiconductor elements is under the maximum load, the other is released from the maximum load, the cooling fin structure and hence the semiconductor device as a whole can be implemented in a significantly reduced size.

BRIEF DESCRIPTION OF THE DRAWINGS

FIG. 9 is a sectional view showing another structure of the semiconductor device according to the invention applied to the inverter shown in FIG. 1;

DESCRIPTION OF THE PREFERRED EMBODIMENTS

Now, the invention will be described in detail in conjunction with the exemplary and preferred embodiments thereof by reference to the drawings, in which parts having like or equivalent functions are denoted by like reference symbols throughout the several figures.

Figure 1:
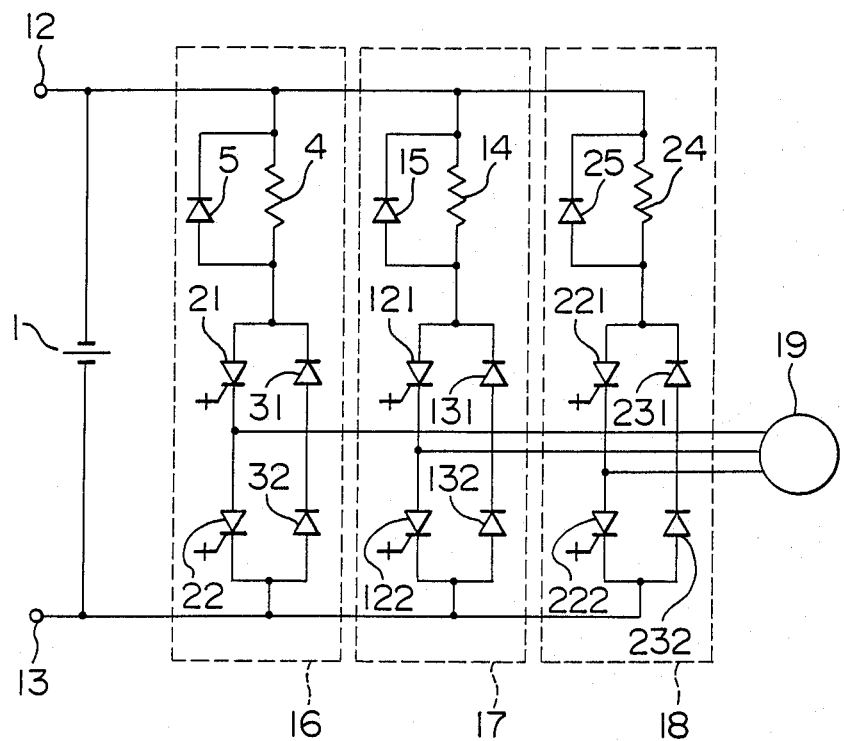
FIG. 1 is a view showing a circuit configuration of an inverter to which the present invention can be applied advantageously.
Figure 2:
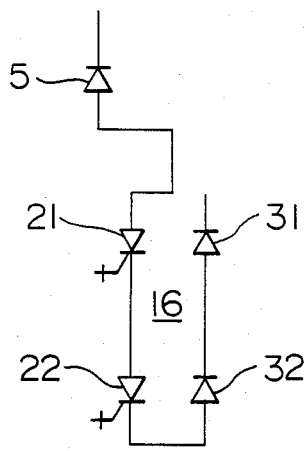
FIG. 2 is a view showing interconnection of GTOs and diodes for one phase adopted heretofore in the inverter shown in FIG. 1.
Figure 3:
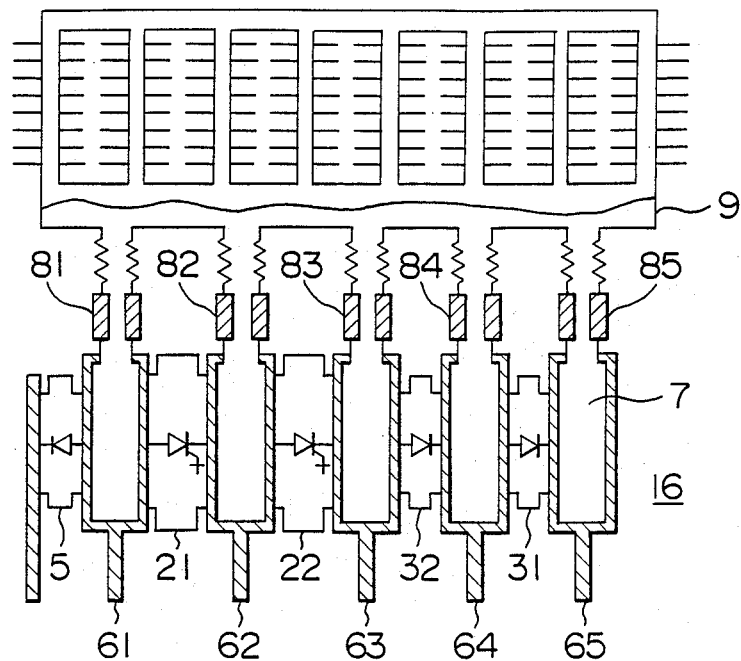
FIG. 3 is a schematic sectional view showing a physical structure of a typical one of the hitherto known semiconductor devices.
Figure 5:
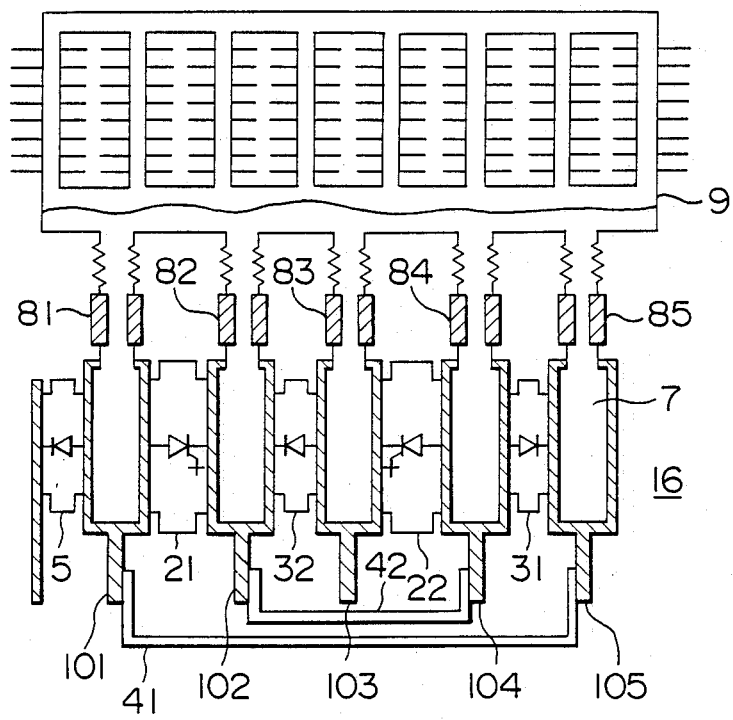
FIG. 5 is a view showing in section a structure of the semiconductor device according to an exemplary embodiment of the invention applied to the inverter shown in FIG. 1.
Figure 4A:
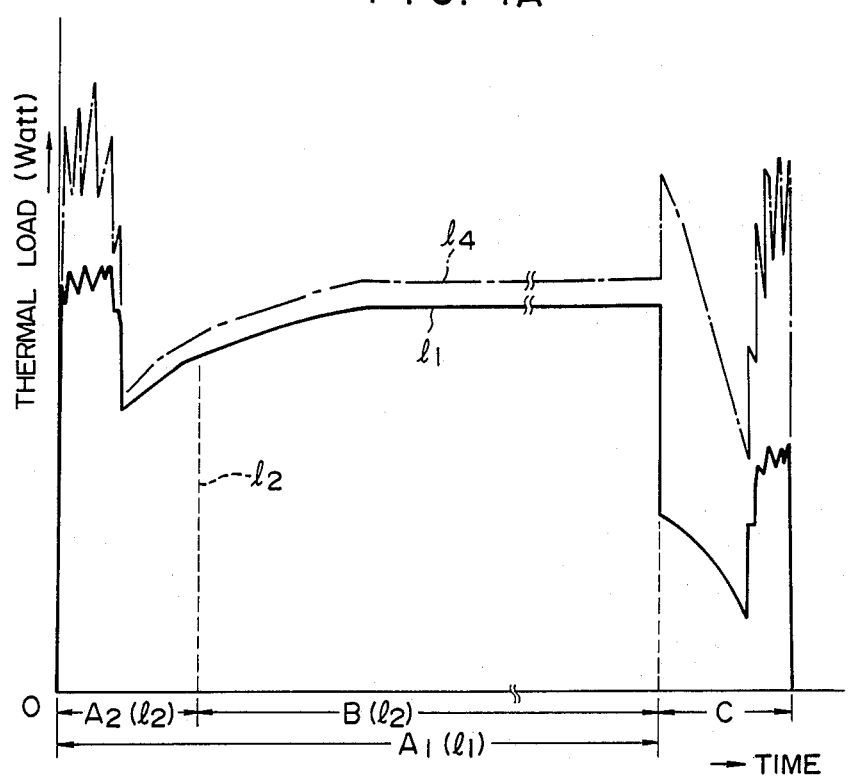
FIGS. 4A and 4B are views for graphically illustrating thermal load characteristics of the inverter when used for controlling a drive motor for an electric car.
Figure 4B:
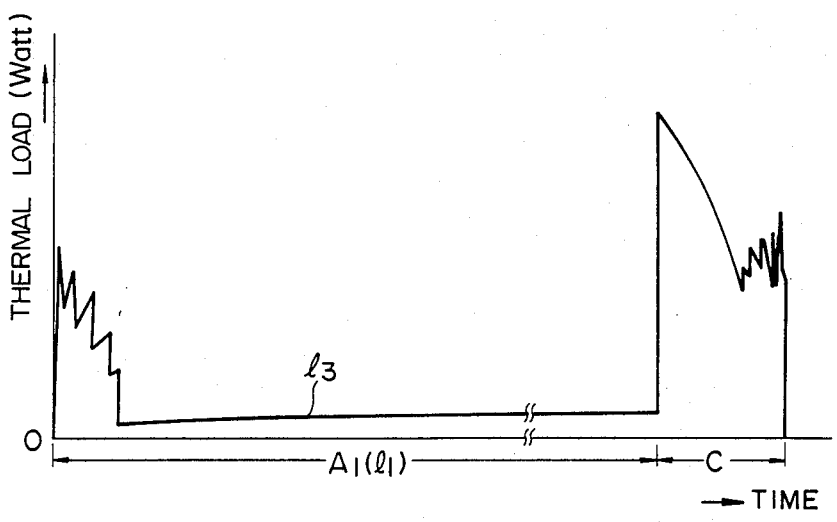
Figure 6:
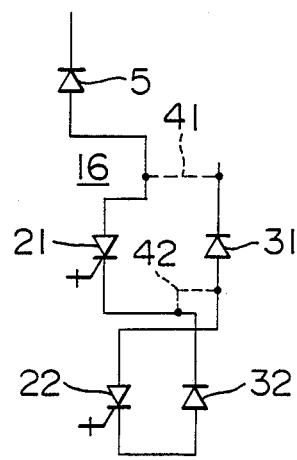
FIG. 6 is a view for illustrating the order in which the individual semiconductor elements shown in FIG. 5 are stacked to one another.

FIG. 5 shows in a sectional view a semiconductor device according to an embodiment of the invention applied to the inverter shown in FIG. 1. More specifically, FIG. 5 shows an arrangement of GTOs 21 and 22 and diodes 5, 31 and 32 for U-phase 16 of the inverter shown in FIG. 1, being understood that the same structure is employed for the V-phase and W-phase, respectively. In FIG. 5, parts serving for the same functions as those shown in FIG. 3 are denoted by like reference symbols. FIG. 6 is a view for illustrating the order or sequence in which the semiconductor elements 5, 21, 22, 31 and 32 are arrayed and interconnected.

As will be seen in FIGS. 5 and 6, the diodes and the GTOs are alternately disposed with the cooling fin being interposed between the adjacent elements, wherein the diode and the GTO are electrically connected to each other by the interposed cooling fin. More specifically, each of the cooling fins 101 to 104 have one side contacted to the GTO and the other side contacted to the diode. As described hereinbefore, these two semiconductor elements are not subjected to the maximum load simultaneously. The cooling fin should preferably be implemented in such a structure that the vaporization of coolant under the heating by the associated semiconductor elements is made use of for effectuating the cooling function. In other words, the cooling fin structure may be identical with the one shown in FIG. 3.

In this connection, it will be noted that since the thermal time constant of the cooling fin is relatively short when compared with the period during which the GTO and the diode are placed under load (in reality, these elements are applied with a relatively large load during a relatively long duration), the cooling fin is required to have heat resistance of the value capable of coping with the maximum load. However, because the semiconductor elements located on both sides of any given cooling fin are never placed under the maximum load at the same time, the cooling fin can be realized in a small size while satisfying the thermal condition as required.

In FIGS. 5 and 6, reference numerals 41 and 42 denote connecting conductors each for interconnecting the two associated cooling fins. By means of these conductors, two anti-parallel connections each including the GTO and the diode are connected in series to each other. More specifically, the connecting conductor 41 connects electrically the cooling fins 101 and 105 to each other, while the connecting conductor 42 connects electrically the cooling fins 102 and 104.

In FIG. 5, it will be seen that no cooling fin is disposed on the left side of the diode 5. This is because the amount of heat generated by this element 5 is so small when compared with that of the other semiconductor elements that cooling at one side of the element 5 is sufficient. Thus, the cooling fin on only the other side of the element 5 can be omitted.

Figure 7:
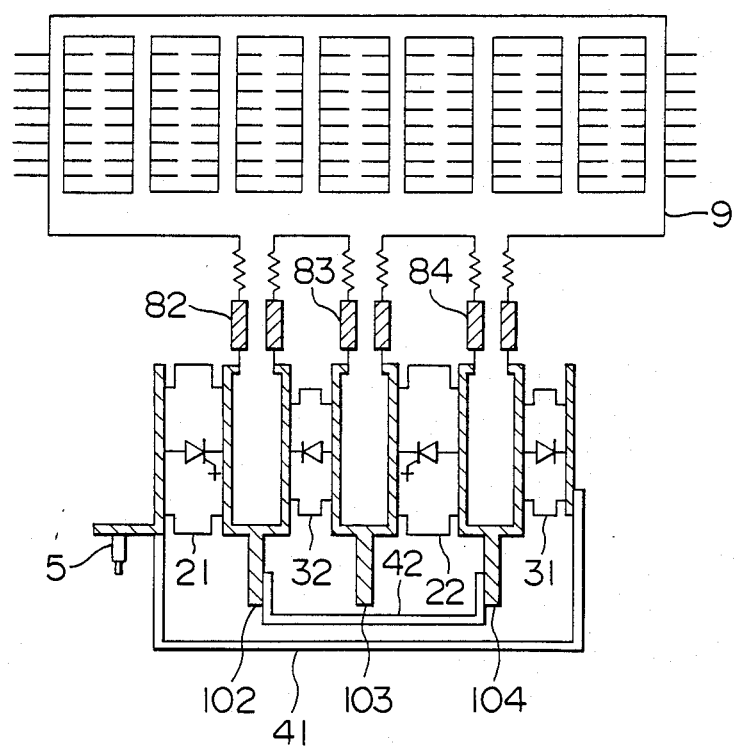
FIG. 7 is a view showing in section a modification of the semiconductor device shown in FIG. 5.

FIG. 7 shows a modification of the semiconductor device shown in FIG. 5. In the case of this modified embodiment, it is supposed that the amount of heat generated by the GTOs 21, 22 and the diodes 31 and 32 is small, so that both the cooling fin 101 on one side of the GTO 21 and the cooling fin 105 on one side of the diode 31 in FIG. 5 are omitted. This is because the diode 31 and the GTO 21 can be adequately cooled only with the respective cooling fins 102 and 104 in this case to substantially same effect as in the case of the preceding embodiment. Parenthetically, the diode 5 may be mounted on the associated electrode of the GTO 21, since the amount of heat generated by this diode 5 is very small.

The structure of the semiconductor device shown in FIG. 7 can be realized in a much smaller size than the one shown in FIG. 5.

Figure 8:
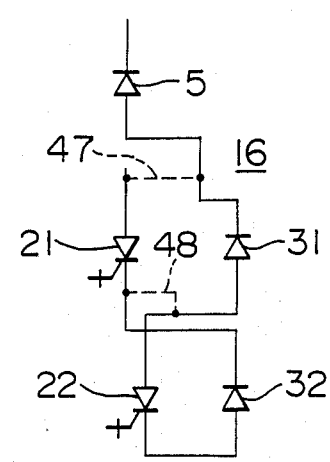
FIG. 8 is a circuit diagram showing another modification of the semiconductor device shown in FIG. 5 with regard to the order of connection of the semiconductor elements.

FIG. 8 shows another modification of the embodiment shown in FIG. 5 and differs from the latter in the order in which the semiconductor elements are connected. More specifically, the diode 5 shown in FIG. 5 is disposed adjacent to the cooling fin 105 in the case of the structure shown in FIG. 7. The connecting conductors 47 and 48 correspond to those denoted by 41 and 42, respectively, in FIG. 5.

In the case of the preceding embodiments, the structure shown in FIG. 5 or 7 is provided for each of phases. FIG. 9 shows another embodiment of the semiconductor device according to the present invention in which the structures for U-, V- and W-phases are implemented integrally to thereby further enhance the miniaturization of the inverter as a whole. As will be seen in FIG. 9, the structure for each phase is of substantially same as the embodiment shown in FIG. 5, in which the GTO 122 for V-phase 17 is disposed adjacent to the cooling fin 105 for U-phase 16 while the GTO 222 for W-phase is disposed adjacent to the cooling fin 109 for V-phase. In FIG. 9, the arrangement of W-phase except for the GTO 222 and the cooling fin 110 is omitted. The diodes 5, 15 and 25 for U-, V- and W-phases may be mounted on the cooling fins 103, 107, and 111, respectively.

According to the embodiment shown in FIG. 9, interphase boundary portions are so arranged that the GTOs and the diodes are located adjacent to one another with interposition of the cooling fins 105 and 109, respectively. Accordingly, both sides of all the cooling fins are not located adjacent to the GTOs as in the case of the embodiment shown in FIG. 5, whereby the thermal burden imposed on the cooling fins can be reduced, which in turn means that the cooling fins can be realized in a reduced size. More specifically, the inverter sections for individual phases can be disposed adjacent to each other by virtue of the alternate stacking of the GTOs and the diodes of the three phases. Therefore, the embodiment of FIG. 9 does not require insulating members which are provided between adjacent phases in case of separately disposing the respective phases, whereby the whole inverter structure can be significantly reduced in size when compare with the structure known heretofore. In FIG. 9, reference numerals 101 to 113 denote the cooling fins, 41 to 46 denote connecting conductors and 87 to 93 denote insulation sleeves.

Figure 10:
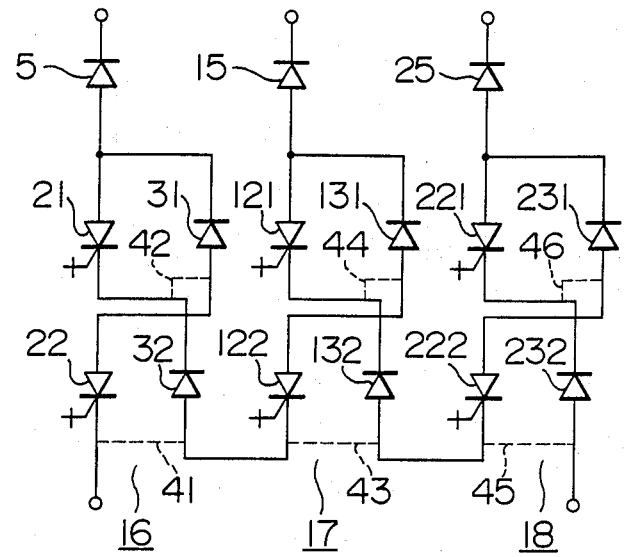
FIG. 10 is a view for illustrating the order in which the individual semiconductor elements are stacked to one another in the semiconductor device shown in FIG. 9.

FIG. 10 is a view for illustrating the order in which the individual semiconductor elements are stacked.

Figure 11:
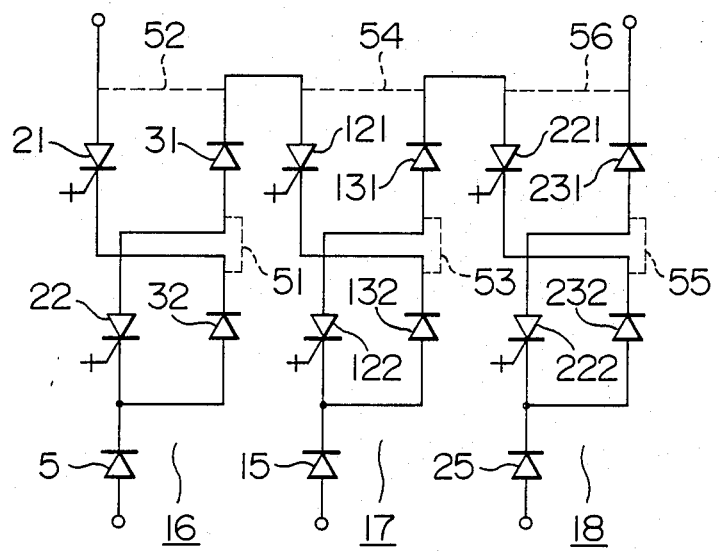
FIG. 11 is a view for illustrating the order in which the individual semiconductor elements of a modified structure of the device shown in FIGS. 9 and 10 are stacked.

FIG. 11 is a view showing the order in which the individual semiconductor elements are stacked in a semiconductor device structure according to a version of the embodiment described above in conjunction with FIGS. 9 and 10. The semiconductor device shown in FIG. 11 differs from the embodiment shown in FIG. 10 in a point that the diodes 5, 15 and 25 are disposed at the side of the terminal 13 and in respect to the order in which the individual semiconductor elements are stacked. Namely, the semiconductor elements are stacked in the order of GTO 21, diode 32, GTO 22, diode 31, GTO 121, diode 132, GTO 122, diode 131, GTO 221, diode 232, GTO 222 and diode 231, wherein the cooling fin is interposed between the adjacent GTO and diode and in which the diodes 5, 12 and 25 are mounted on the cooling fins located on the cathode sides of the associated GTOs 22, 122 and 222, respectively. In FIG. 11, broken line segments 51 to 56 denote connecting conductors.

Figure 12:
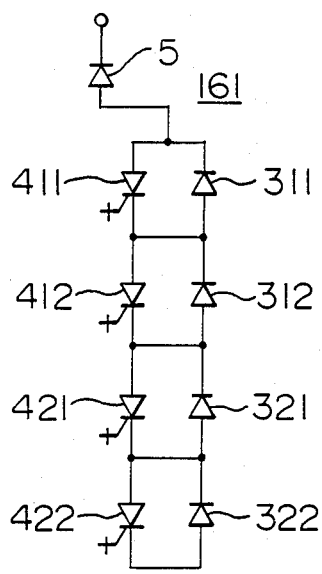
FIG. 12 is a view showing a circuit configuration of another example of the inverter to which the invention can be applied.

FIG. 12 is a circuit diagram for one phase of another example of the inverter circuit to which the present invention is to be applied. The inverter circuit 161 shown in FIG. 12 is of such configuration in which two circuits each composed of the GTOs 21, 22 and diodes 31, 32 connected as shown in FIG. 1 are connected in series to each other.

Figure 13:
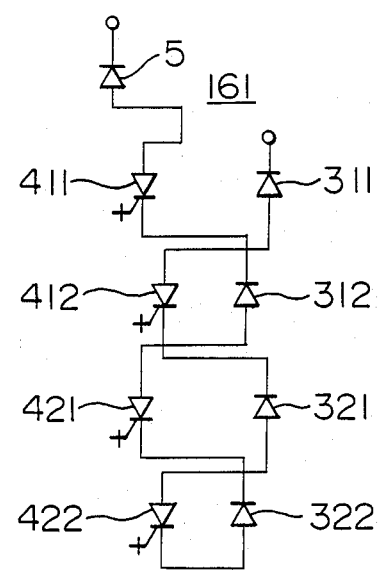
FIG. 13 is a view for illustrating the order in which the individual semiconductor elements are stacked in implementing the inverter circuit device shown in FIG. 12.

FIG. 13 shows the order in which the individual semiconductor elements (diodes 5, 311, 312, 321 and 322 and the GTOs 411, 412, 421 and 422) are stacked according to the teaching of the invention in the inverter circuit shown in FIG. 12. In this figure, the connecting conductors are omitted from illustration.

Figure 14:
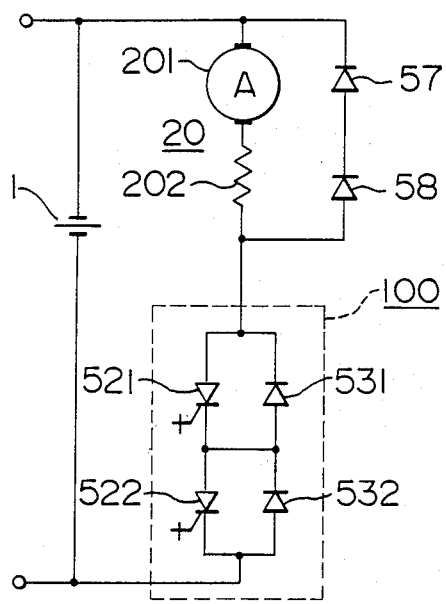
FIG. 14 is a view showing a typical circuit configuration of a chopper circuit to which the invention can be applied.

FIG. 14 is a view showing a main portion of a typical chopper circuit designed for controlling a DC motor. When the concept of the present invention is applied to this type of chopper circuit, the advantageous effects mentioned in the foregoing can be obtained.

In the chopper circuit shown in FIG. 14, a DC voltage is applied across the serial connection of an armature 201 and a field system 202 of a DC motor 20 and a chopper 100. The chopper 100 includes as main components thereof the GTOs 521 and 522 connected in series and the diodes 531 and 532 connected in anti-parallel with these GTOs or thyristors 521 and 522, respectively. Free-wheel diodes 57 and 58 are connected in parallel with the DC series motor 20.

Figure 15:
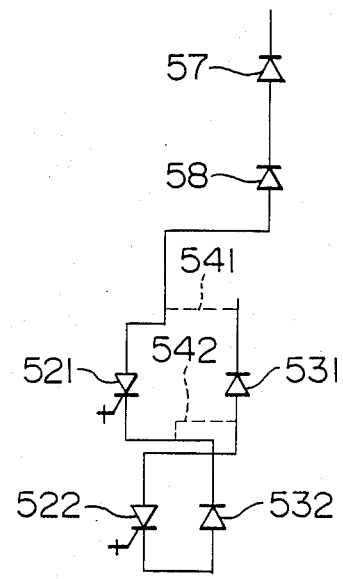
FIG. 15 is a view for illustrating the order in which the individual semiconductor elements are stacked in implementing the chopper circuit shown in FIG. 14.

FIG. 15 is a view for illustrating the order in which the individual semiconductor elements are stacked in the chopper circuit shown in FIG. 14 according to the teaching of the present invention. As will be seen in FIG. 15, the semiconductor elements are stacked in the order of GTO 521, diode 532, GTO 522 and diode 531, wherein a cooling fin is interposed between the adjacent GTO and diode.

In the case of the instant embodiment, it is preferred that the cooling fin is also provided between the diodes 57 and 58 since a large current flow takes place in these diodes when the GTOs 521 and 522 are in the off-state. In FIG. 15, reference numerals 541 and 542 denote connecting conductors.

Figure 16:
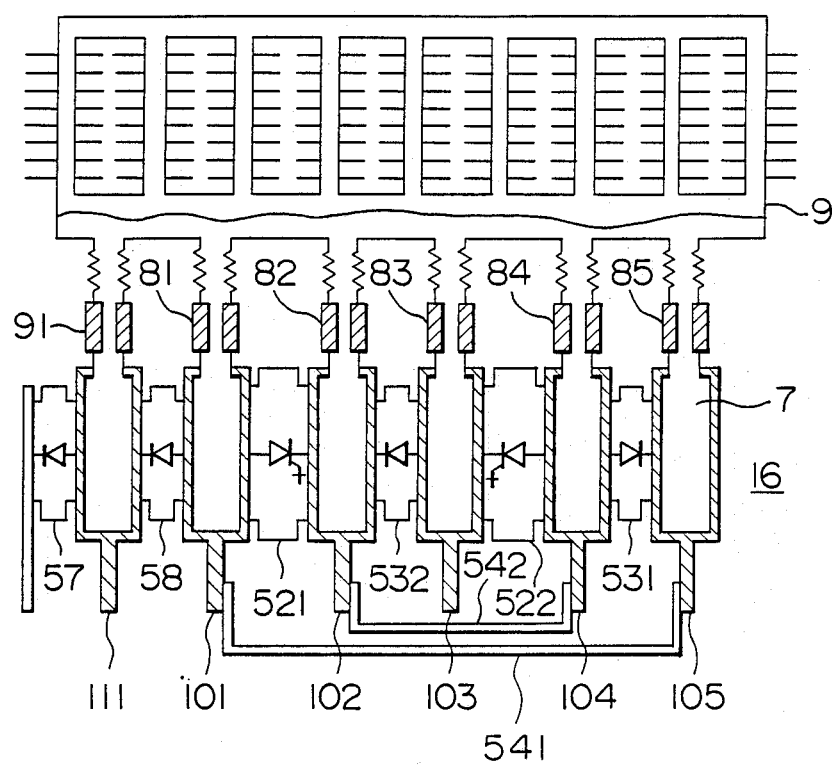
FIG. 16 is a sectional view of the semiconductor device according to the embodiment shown in FIG. 15.

FIG. 16 shows in a sectional view a physical structure of the semiconductor device according to the instant embodiment. In this embodiment, the cooling fin 105 may be eliminated since the amount of heat generated by the diodes 531, 532 is very small.

As will be appreciated from the foregoing description, it is taught according to the present invention that in a semiconductor device including a circuit in which a plurality of anti-parallel connections each composed of a thyristor and a diode are connected in series, the thyristors and diodes are alternately arrayed with the cooling fin interposed between any adjacent thyristor and diode, the cooling fin serving for depriving the thyristors and the diodes of heat generated by them by making use of boil phenomenon of a coolant. In this manner, the thyristor and the diode which differ from each other in respect to the time point at which they are loaded can share the same cooling fin. In other words, the cooling fin can be implemented in such a size which can present a cooling capability only enough to cope with the maximum load condition of one semiconductor element, whereby the whole structure of the semiconductor device can be significantly reduced. Further, by forming the cooling fin of an electrically conductive material, the adjacent thyristor and diode can have a same potential, thus rendering unnecessary any insulation layer which would otherwise have to be interposed. This contributes to further miniaturization of the semiconductor device.

As will now be appreciated, the present invention is very advantageous in miniaturizing the semiconductor device by reducing the size of the cooling fins.

The foregoing description has been made on the assumption that the present invention is applied to the inverter circuit and the chopper circuit. It should however be understood that the invention is never restricted to these circuits but applicable to any other circuit which comprises a plurality of anti-parallel circuits each of first and second semiconductor elements and connected in series and in which the first and second semiconductor elements differ from each other in respect to the time point at which the respective maximum loads are applied.

Further, although the invention has been described in conjunction with the circuit in which a plurality of anti-parallel connections each composed of two different types of semiconductor elements are connected in series to one another, it goes without saying that the invention can be equally applied to the circuit in which the anti-parallel connection includes three or more semiconductor elements.

Figure 17:
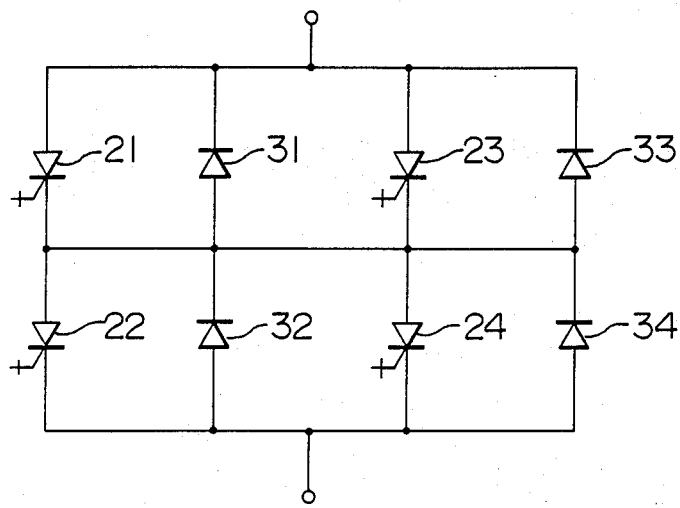
FIG. 17 is a view showing a circuit configuration of the semiconductor device to which the present invention can be applied.
Figure 18:
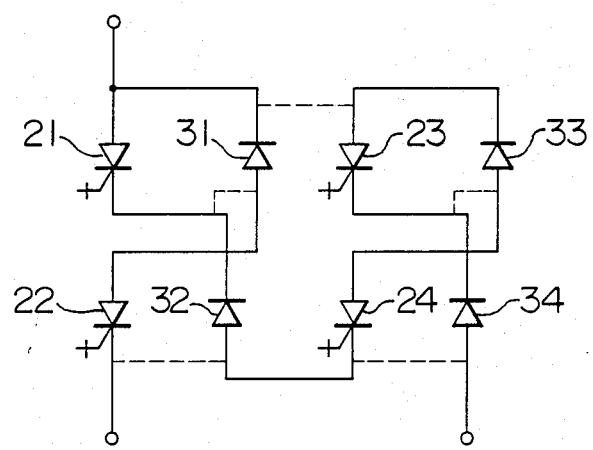
FIG. 18 is a view for illustrating the order in which the individual semiconductor elements are stacked in implementing the inverter circuit of FIG. 17.

FIG. 17 shows a circuit configuration of a semiconductor device wherein two GTOs and two diodes are connected in an antiparallel configuration and two antiparallel connections are connected in series. FIG. 18 shows the order in which the individual semiconductor elements of FIG. 17 are stacked to one another.

We claim:

1. A semiconductor device comprising:
   a first laminated member comprised of a pair of first and second semiconductor elements and a first cooling member, wherein said first and second semiconductor elements each have an anode side and a cathode side, and further wherein the anode side of the first semiconductor element and the anode side of the second semiconductor element are opposed to each other through the first cooling member;
   a second laminated member comprised of another pair of first and second semiconductor elements and a second cooling member, wherein said another pair of first and second semiconductor elements each have an anode side and a cathode side, and further wherein the cathode side of the another first semiconductor element and the cathode side of the another second semiconductor element are opposed to each other through the second cooling member
   a laminated block constituted by said first and second laminated members and a third cooling member in a manner that the cathode side of the second semiconductor element of said first laminated member and the anode side of the first semiconductor element of said second laminated member are opposed to each other through the third cooling member;
   electrical terminals provided at both end portions of said laminated block; and
   a connecting conductor for electrically connecting said first and second cooling members of said laminated block and a connecting conductor for electrically connecting said electrical terminals of said laminated block, to thereby constitute a circuit wherein two anti-parallel connections each having a pair of the first and second semiconductor elements are connected in series.

2. A semiconductor device according to claim 1, wherein each of said electrical terminals provided at both end portions of said laminated block is a cooling member.

3. A semiconductor device according to claim 1, wherein each of said first, second and third cooling members contains internally a cooling medium which is boiled by heat generated by the adjacent semiconductor elements to be vaporized for thereby cooling said adjacent semiconductor elements.

4. A semiconductor device according to claim 1, wherein said semiconductor device is an inverter circuit in which said second and first semiconductor elements are constituted by a gate turn-off thyristor and a diode, respectively.

5. A semiconductor device comprising:
first and second laminated members each comprised of a pair of first and second semiconductor elements and a first cooling member in a manner that an anode side of the first semiconductor element is opposed to an anode side of the second semiconductor element through the first cooling member;
third and fourth laminated members each comprised of a pair of first and second semiconductor elements and a second cooling member in a manner that a cathode side of the first semiconductor element is opposed to a cathode side of the second semiconductor element through the second cooling member;
a first laminated block comprised of said first and second laminated members and a third cooling member in a manner that a cathode side of said second semiconductor element of said first laminated member is opposed to a cathode side of said first semiconductor element of said second laminated member through the third cooling member;
a second laminated block comprised of said third and fourth laminated members and a fourth cooling member in a manner that an anode side of said second semiconductor element of said third laminated member is opposed to an anode side of said first semiconductor element of said fourth laminated member through the fourth cooling member;
a laminated block unit comprised of said first and second laminated blocks and a fifth cooling member in a manner that a cathode side of said second semiconductor element at an end portion of said first laminated block is opposed to an anode side of said first semiconductor element at an end portion of said second laminated block through the fifth cooling member;
electrical terminals provided at both end portions of said laminated block unit; and
a connecting conductor for electrically connecting said first cooling member of said second laminated member and said second cooling member of said third laminated member, a connecting conductor for electrically connecting said first cooling member of said first laminated member and said second cooling member of said fourth laminated member, a connecting member for electrically connecting said third and fourth cooling members, and a connecting conductor for electrically connecting said electrical terminals provided at both end portions of said laminated block unit, to thereby constitute a circuit wherein four anti-parallel connections each having a pair of the first and second semiconductor elements are connected in series.

6. A semiconductor device according to claim 5, wherein each of said first to fifth cooling members contains internally a cooling medium which is boiled by heat generated by the adjacent semiconductor elements to be vaporized for thereby cooling said adjacent semiconductor elements.

7. A semiconductor device according to claim 5, wherein said semiconductor device is an inverter circuit in which said first and second semiconductor elements are comprised of a diode and a gate turn-off thyristor, respectively.

8. A semiconductor device comprising:
a plurality of laminated blocks, each of the laminated blocks being comprised of first and second laminated members, said first laminated member being comprised of a pair of first and second semiconductor elements and a first cooling member in a manner that an anode side of the first semiconductor element is opposed to an anode side of the second semiconductor element through the first cooling member, and said second laminated member being comprised of another pair of first and second semiconductor elements and a second cooling member in a manner that a cathode side of the another first semiconductor element is opposed to a cathode side of the another semiconductor element through the second cooling member, each of the laminated blocks being further comprised of a third cooling member in a manner that a cathode side of a second semiconductor element of the first laminated member and an anode side of a first semiconductor element of the second laminated member are opposed to each other through the third cooling member;
a laminated block unit comprised of said plurality of laminated blocks and at least one fourth cooling member in a manner that the cathode side of the first semiconductor element of said first laminated member of one of said laminated blocks is connected through the fourth cooling member to the anode side of said second semiconductor element of said second laminated member of another one of said laminated blocks;
electrical terminals provided at both end portions of said laminated block unit; and
a connecting conductor for electrically connecting the first and second cooling members in each of said laminated blocks and connecting conductors for electrically connecting each of said fourth cooling members to said electrical terminals.

9. A semiconductor device according to claim 8, wherein each of said first, second, third and fourth cooling members contains internally a cooling medium which is boiled by heat generated by the adjacent semiconductor elements to be vaporized for thereby cooling said adjacent semiconductor elements.

10. A semiconductor device according to claim 8, wherein said semiconductor device is an inverter circuit in which said second and first semiconductor elements are comprised of a gate turn-off thyristor and a diode, respectively.

11. A semiconductor device according to claim 8, wherein each of said electrical terminals provided at both end portions of said laminated block unit is a cooling member.

* * * * *